United States Patent
Ray et al.

(10) Patent No.: US 6,643,832 B1
(45) Date of Patent: Nov. 4, 2003

(54) VIRTUAL TREE-BASED NETLIST MODEL AND METHOD OF DELAY ESTIMATION FOR AN INTEGRATED CIRCUIT DESIGN

(75) Inventors: Partha P. Data Ray, Saratoga, CA (US); Mikhail I. Grinchuk, Mountainview, CA (US); Pedja Raspopovic, Raleigh, NC (US)

(73) Assignee: LSI Logic Corporation, Milpitas, CA (US)

(*) Notice: Subject to any disclaimer, the term of this patent is extended or adjusted under 35 U.S.C. 154(b) by 51 days.

(21) Appl. No.: 09/964,011

(22) Filed: Sep. 26, 2001

Related U.S. Application Data
(60) Provisional application No. 60/236,953, filed on Sep. 29, 2000.

(51) Int. Cl.[7] .............................. G06F 17/50; G06F 9/45
(52) U.S. Cl. ................................... 716/6; 716/4; 703/15
(58) Field of Search ........................... 716/6, 4; 703/15

(56) References Cited

U.S. PATENT DOCUMENTS

| | | |
|---|---|---|
| 5,495,419 A | 2/1996 | Rostoker et al. |
| 5,500,808 A * | 3/1996 | Wang .......................... 703/19 |
| 5,909,376 A | 6/1999 | Scepanovic et al. |
| 6,099,580 A | 8/2000 | Boyle et al. .................. 716/7 |

OTHER PUBLICATIONS

Wu et al., Accurate Speed Improvement Techniques for RC line and tree interconnections in CMOS VLSI, IEEE International Symposium on Circuits and Systems, pp. 1648–1651, May 1990.*

* cited by examiner

*Primary Examiner*—Matthew Smith
*Assistant Examiner*—A. M. Thompson
(74) *Attorney, Agent, or Firm*—Westman, Champlin & Kelly

(57) ABSTRACT

A pre-placement delay model for a logical function block of an integrated circuit design includes a fan-in count variable, a fan-out count variable and a delay variable. The fan-in count variable has a value indicative of a number of inputs to the logical function block. The fan-out count variable has a value indicative of the number of inputs of other logical function blocks that are driven by an output of the logical function block. The delay variable has a value that is a function of the binary logarithm of the fan-in count variable and the binary logarithm of the fan-out count variable.

15 Claims, 4 Drawing Sheets

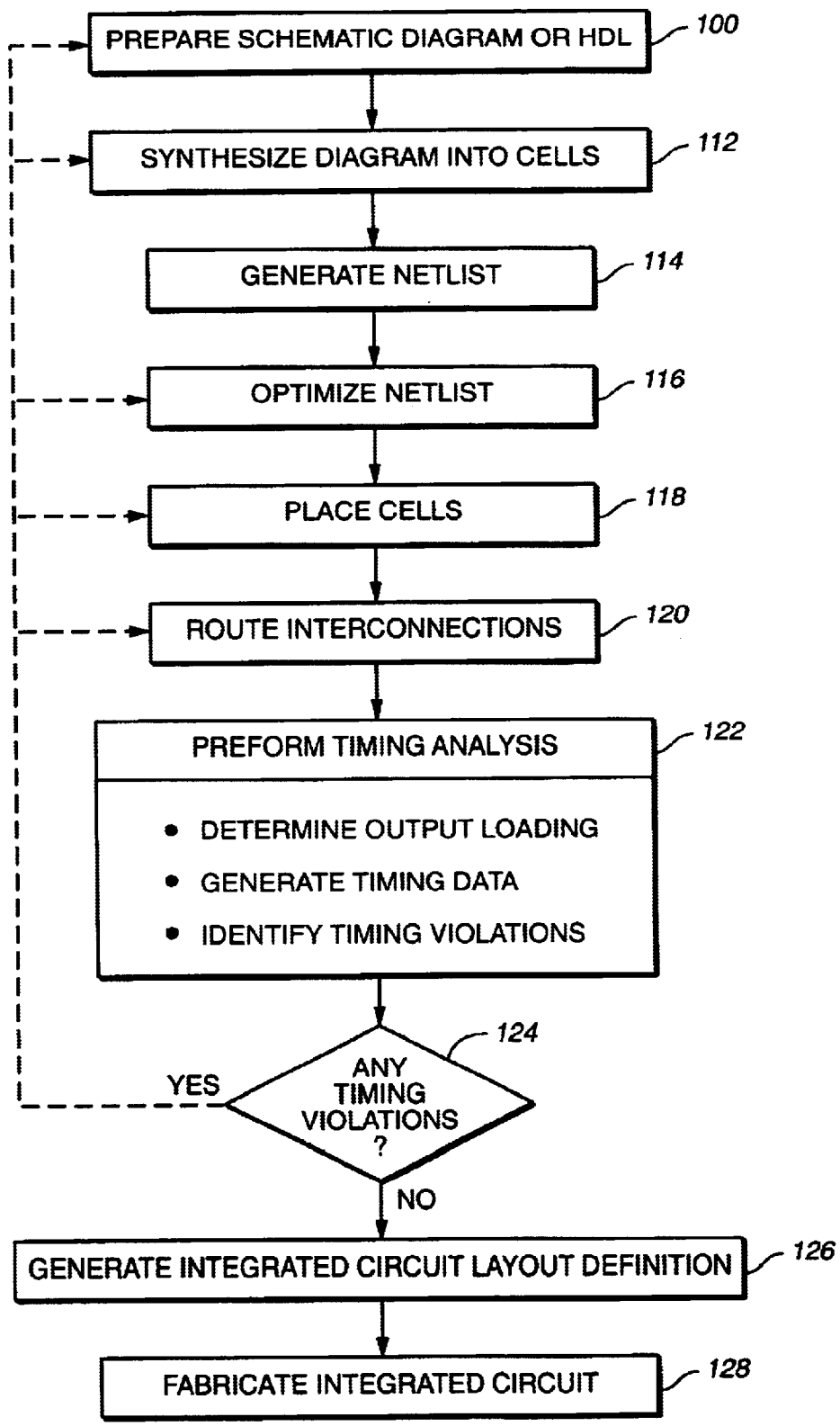
FIG._1

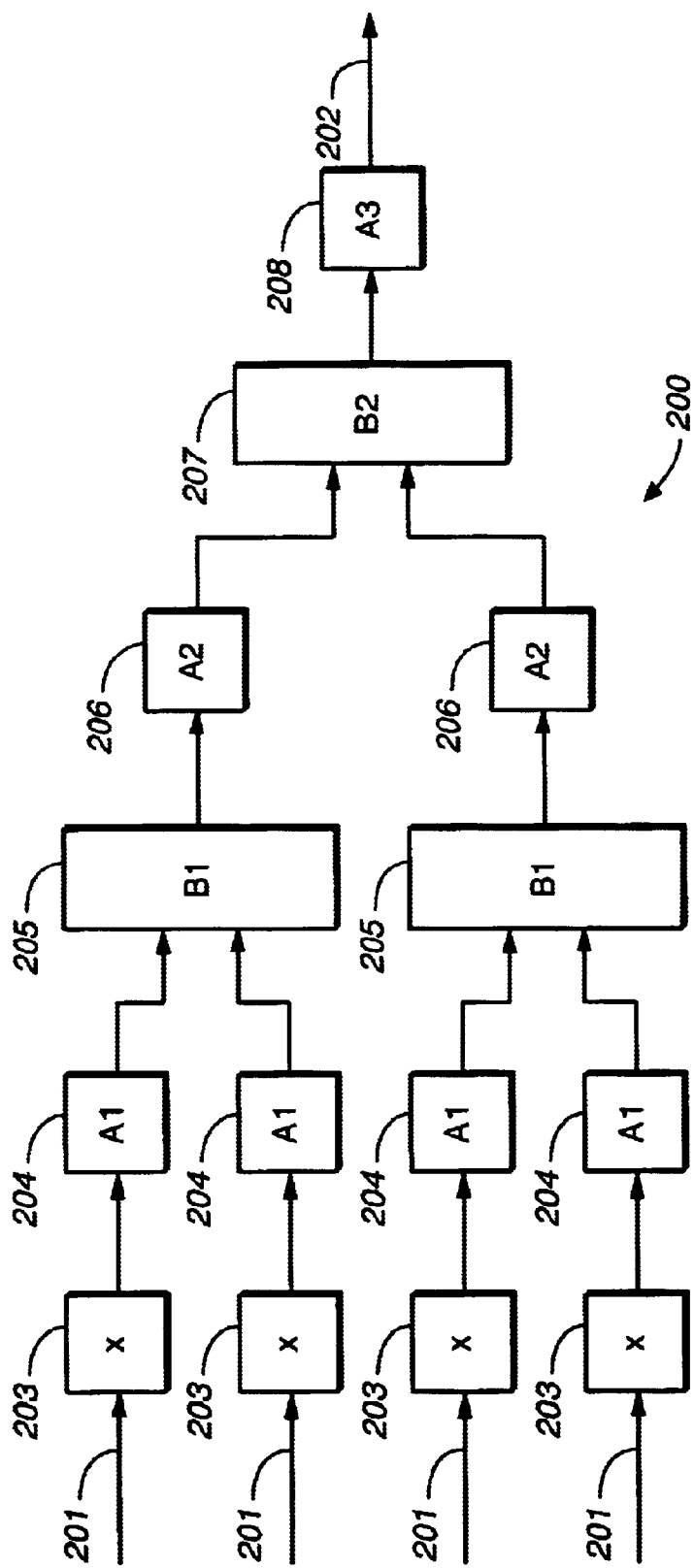
FIG._2

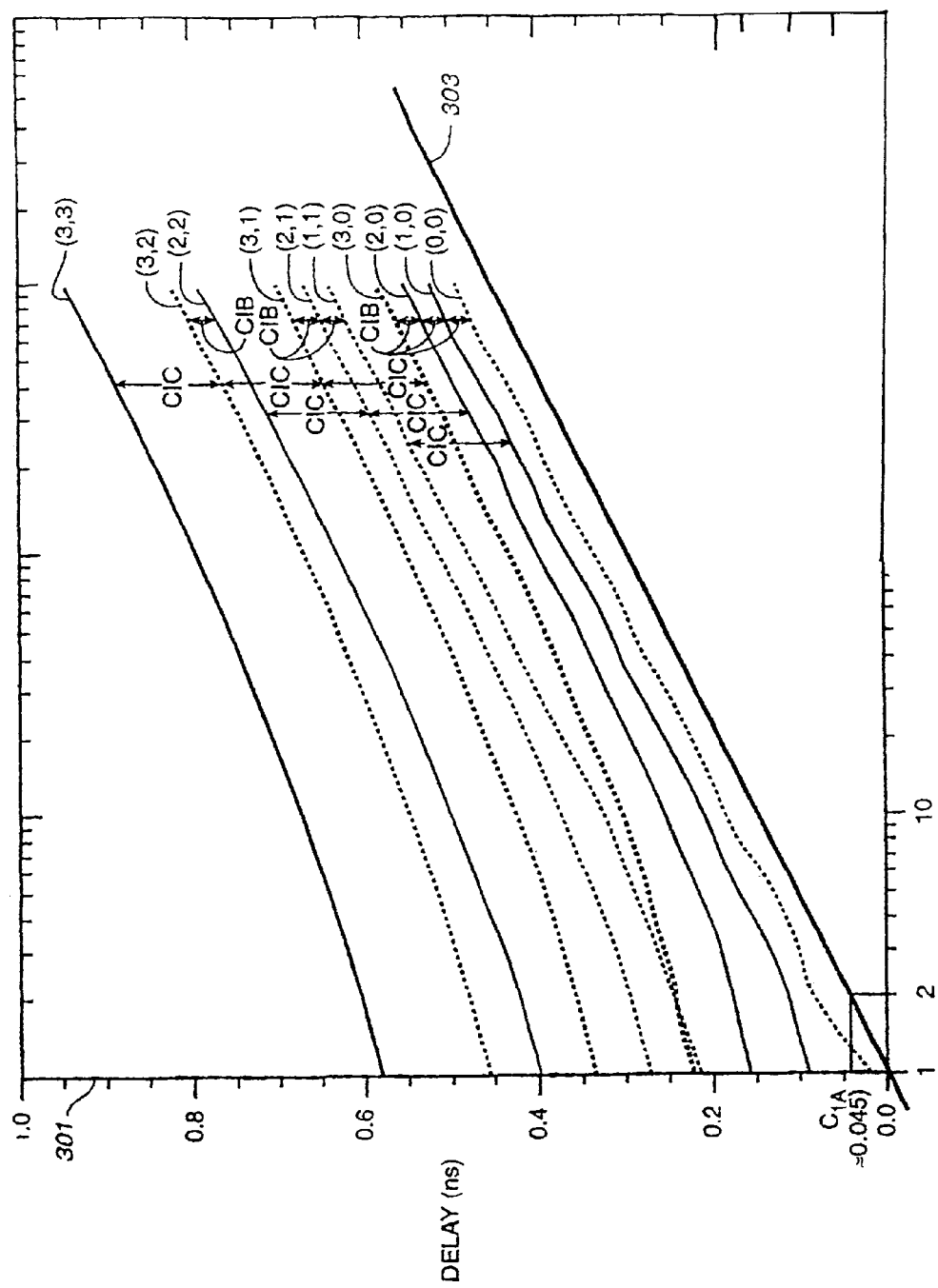
FIG._3

Step 1. Initialization.

if F is NOT(x), let delay(F, Load) = D(G, load), for each load=0,1,...,$L_{MAX}$.

where G is "most standard" inverter of the given technology library (such as an N1A in the library G11 and N1AFP in the library G12 of LSI Logic Corporation);

For all remaining functions F, let all values delay(F, load) be +infinity (actually, a large number).

Step 2. Main loop

```
For load = 0,1,...,L_MAX
   For each gate G from S
      Begin
      |   if G has 1 input, then n = 0;
      |   else (i.e. if G has 2 inputs) n = 1.
      |
      |   For i = 0,1,...,NL_MAX-n
      |      For j = 0,1,...,1
      |         For k = 1,2,...,N_MAX
      |            For each function F from group (i, j)
      |               Begin
      |               |
      |               |  Let H be composition of functions G and F,
      |               |  i.e. -function G(F) for 1-input Fs, or
      |               |  G(F(x1,...,xN),F(y1,...,yN)) for 2-input Fs
      |               |    (N = fan-in of F)
      |               |
      |               |  Let X = D(G, load/k) + delay(F, k C)
      |               |
      |               |  (if the product k C is not an integer,
      |               |  we use linear interpolation; if k C > L_MAX,
      |               |  we suppose that X = +infinity)
      |               |
      |               |  new value of delay(H, load) =
      |               |                   min(X, the old one)
      |               End
      End
   End
Repeat Step 2 until there are no more changes in the values
of delay(F, load)
```

FIG. 4

VIRTUAL TREE-BASED NETLIST MODEL AND METHOD OF DELAY ESTIMATION FOR AN INTEGRATED CIRCUIT DESIGN

CROSS REFERENCE TO RELATED APPLICATION

This application claims the benefits of U.S. Provisional Application No. 60/236,953, filed Sep. 29, 2000, and entitled "VIRTUAL TREE-BASED NETLIST MODEL AND METHOD OF DELAY ESTIMATION FOR AN INTEGRATED CIRCUIT DESIGN."

Cross-reference is also made to U.S. application Ser. No. 09/964,030, filed on even date herewith, and entitled "METHOD AND APPARATUS FOR ADAPTIVE TIMING OPTIMIZATION OF AN INTEGRATED CIRCUIT DESIGN."

BACKGROUND OF THE INVENTION

The present invention relates to the design of semiconductor integrated circuits, and more specifically to an analytical model for estimating delays of logic gates in a netlist before mapping the netlist to any particular technology library and prior to placing and routing the netlist.

Semiconductor integrated circuits are traditionally designed and fabricated by first preparing a schematic diagram or hardware description language (HDL) specification of a logical circuit in which functional elements are interconnected to perform a particular logical function. With standard cell technology, the schematic diagram or HDL specification is synthesized into standard cells of a specific cell library.

Each cell corresponds to a logical functions unit, which is implemented by one or more transistors that are optimized for the cell. The logic designer selects the cells according to the number of loads that are attached to the cell, as well as an estimated interconnection required for routing. The cells in the cell library are defined by cell library definitions. Each cell library definition includes cell layout definitions and cell characteristics. The cell layout definition includes a layout pattern of the transistors in the cell, geometry data for the cell's transistors and cell routing data. The cell characteristics include a cell propagation delay and a model of the cell's function. The propagation delay is a function of the internal delay and the output loading (or "fan-out") of the cell.

A series of computer-aided design tools generate a netlist from the schematic diagram or HDL specification of the selected cells and the interconnections between the cells. The netlist is used by a floor planner or placement tool to place the selected cells at particular locations in an integrated circuit layout pattern. The interconnections between the cells are then routed along predetermined routing layers. The design tools then determine the output loading of each cell as a function of the number of loads attached to each cell, the placement of each cell and the routed interconnections.

A timing analysis tool is then used to identify timing violations within the circuit. The time it takes for a signal to travel along a particular path or "net" from one sequential element to another depends on the number of cells in the path, the internal cell delay, the number of loads attached to the cells in the path, the length of the routed interconnections in the path and the drive strengths of the transistors in the path.

A timing violation may be caused by a number of factors. For example, a particular cell may not have a large enough drive strength to drive the number of loads that are attached to that cell. Also, exceptionally long routing paths may cause timing violations. Timing violations are eliminated by making adjustments at each stage in the layout process. For example, an under-driven cell may be fixed by changing the logic diagram to include a cell having a larger drive strength. Alternatively, the logic diagram can be changed to divide the loads between one or more redundant cells or buffer cells. An exceptionally long routing path can be corrected by adjusting the placement of the cells.

Once the timing violations have been corrected, the netlist, the cell layout definitions, the placement data and the routing data together form an integrated circuit layout definition, which can be used to fabricate the integrated circuit.

Few attempts have been made to estimate delay before a netlist has been mapped to a particular technology library and subsequently placed and routed. Unavailability of any wire length information as well as absence of exact load-delay behavior of generic (unmapped) logic elements makes delay estimation an open problem.

All estimations of wire lengths (and hence the wire loads) before placing the cells and routing their interconnections are significantly inaccurate and mislead the design tool using them. Mapping the netlist into specific cells of a particular technology library is therefore done without any delay information or with grossly inaccurate (statistical) delay information. Also, the transformation of large function blocks, such as multiple-input and multiple-output elements, into smaller logical functions or cells is also done with limited delay information. The technology mapping and transformations are subsequently improved upon iteratively with delay information obtained from placement and routing. As a result, the initial placement and routing is not timing driven since little or no timing information is available at this stage in the fabrication process.

In the past, delay models for unmapped netlists rely on an approximate calculation of the number of logic levels in each gate or cell. Thus, the gate delay estimation is based only on the type of gate. Other models have placed a restriction on the fan-out of each gate output to limit error in the gate delay estimation as the load increases. These two models are easy to use, but are not very accurate.

In another model, each gate model is described by estimated capacitances of its inputs, and delay (for a specific output pin of the gate) depends on the type of gate as well as the total capacitance of all input pins of other gates driven by this output pin. This model is quite accurate, but is not local enough. For example, delay along a particular path can depend on the input capacitances of gates that do not belong to the path if an output pin on that path drives input pins of gates that are not on the path.

Improved methods and analytical delay models are desired for estimating delays of cells in a netlist before mapping the netlist to a particular technology library and prior to placing and routing the netlist.

SUMMARY OF THE INVENTION

One aspect of the present invention relates to a pre-placement delay model for a logical function block of an integrated circuit design, which includes a fan-in count variable, a fan-out count variable and a delay variable. The fan-in count variable has a value indicative of a number of inputs to the logical function block. The fan-out count variable has a value indicative of the number of inputs of other logical function blocks that are driven by an output of the logical function block. The delay variable has a value that is a function of the binary logarithm of the fan-in count variable and the binary logarithm of the fan-out count variable.

Another aspect of the present invention relates to a method of modeling delay through a logical function block within an integrated circuit design prior to placement and routing. The method includes (a) identifying a fan-in count indicative of a number of inputs to the logical function block; (b) identifying a fan-out count indicative of a number of inputs to other logical function blocks in the integrated circuit design that are driven by an output of the logical function block; and (c) producing a propagation delay estimate for the logical function block as a function of the binary logarithm of the fan-in count and the binary logarithm of the fan-out count.

Yet another aspect of the present invention relates to a semiconductor cell library which, for each cell in the library, includes a functional model and a propagation delay model. The propagation delay model models propagation delay through the cell as a function of only two design variables, a fan-in count variable and a fan-out count variable. The fan-in count variable indicates a number of inputs to the cell, and the fan-out count variable indicates a number of inputs of other cells that are driven by an output of that cell.

BRIEF DESCRIPTION OF THE DRAWINGS

FIG. 1 is a flowchart of a layout process in which delay estimation models of the present invention can be used according to one embodiment of the present invention.

FIG. 2 is a diagram illustrating an example of a 2-level logic tree that uses basic actual technology gates to implement a Boolean function, F.

FIG. 3 is a graph illustrating the typical behavior of delay(F, load) dependencies for ten different classes of Boolean functions, F.

FIG. 4 is a diagram illustrating an example of an algorithm for calculating an array of delay(F, load) values for each function, F, of each of the classes shown in FIG. 3.

DETAILED DESCRIPTION OF ILLUSTRATIVE EMBODIMENTS

FIG. 1 is a flowchart of a layout process in which delay estimation models can be used according to one embodiment of the present invention. The first step in the layout process is to prepare a schematic diagram or HDL specification in which functional elements are interconnected to perform a particular logical function, at step 100. At step 112, the schematic diagram or HDL specification is synthesized into cells of a cell library. Each cell library has an associated cell definition having physical data and timing characteristics associated with that cell. In one embodiment, the diagram is synthesized into a generic cell library that can be mapped into a specific cell library for a particular manufacturer or technology in subsequent process steps. In another embodiment, the diagram is synthesized directly into a specific cell library.

As described in more detail below, the cell characteristics include a virtual tree-based analytical delay model, which estimates typical cell propagation delays, and a generic model of the cell's function. The cell layout definition includes an estimated layout pattern of the transistors in the cell, estimated geometry data for the cell's transistors and estimated cell routing data.

The virtual tree-based analytical delay model estimates the delay dependence on the number of inputs to the cell (or "fan-in" count) and the load driven by the cell (or "fan-out" count"). The delay model is generalized so that a few general parameters can be used to model the delay behavior of various multi-input and multi-fanout elements in an unmapped netlist. For each basic cell, different technology libraries provide tables of delay as function of output load, as well as tables of input capacitances. This information is used to arrive at values for these generalized parameters so that fairly accurate delay models can be obtained for the unmapped netlist elements. The delay models are fully local. The estimated delay along a particular path depends only on a sum of the gate delay estimates of the gates in that path, not the input capacitances of other gates not in the path. The result is a delay model is easy to calculate given the "fan-in" count and the "fan-out" count and has convenient mathematical properties that can be used by subsequent process steps.

At step 114, the design tools generate a netlist of the selected cells and the interconnections between the cells. In a typical logic diagram or HDL specification, the netlist would include one or more blocks of large, multiple-input or multiple-output logic structures that can be expanded later into tree-like structures of smaller logic functions or cells. Two common variants of these structures include multiple-input logic functions such as large trees of AND, OR, and XOR gates, and any inversions thereof at their inputs or outputs, and large buffer trees, which are often inserted into a netlist to distribute signals from cells having outputs pins with large fanouts (i.e. large output loading). Each of these structures can be implemented with a variety of internal circuit configurations, with each configuration resulting in a potentially different propagation delay from a particular input to a particular output. Therefore, one of these configurations may be more beneficial than another, depending on the arrival times of signals on each pin of the logic block, the required arrival times for each pin and the timing of surrounding circuitry that interfaces with the block.

At step 116, an optimization algorithm optimizes the entire netlist by expanding each of these multiple-input and multiple-output blocks into an optimal one of its respective circuit configurations and providing resulting delay estimates for each structure to subsequent steps in the layout process. This optimization is performed using the virtual tree-based delay models of each cell in the netlist. Since these models provide fairly accurate timing information, the optimization algorithm can optimize gate trees and fan-out buffer trees into circuit configurations that are timing-based. The placement and routing steps 118 and 120 can therefore be timing-driven, resulting in a more effective initial placement and route.

At step 118, the cells in the optimized netlist are placed by arranging the cells in particular locations to form a layout pattern for the integrated circuit. Once the cells have been placed, the interconnections between the cells are routed, at step 120, along predetermined routing layers.

A timing analysis tool is used, at step 122, to generate timing data for the electrical signal paths and to identify any timing violations. The timing analysis tool first determines the output loading of each cell based on the routed interconnections of that cell and the input loading of the driven cells. Based on the output loading of each cell, the timing analysis tool generates timing data and identifies any timing violations. A timing violation occurs when a signal does not reach a particular pin in the netlist at within an appropriate time window. The use of virtual tree-based delay models allows the optimization algorithm performed at step 116 to optimize large, multiple-input and multiple-output blocks to reduce or eliminate timing violations that would otherwise occur after placement and routing in steps 118 and 120. This reduces the number of design iterations required to provide an integrated circuit that has no timing violations. If there are any remaining timing violations, at step 124, the logic designer and/or design tools can return to prior process steps, as indicated by dashed line 123, to correct these timing violations. However, since placement and routing steps were timing-driven, the number of design iterations through these process steps are significantly reduced or eliminated.

Once all of the timing violations have been corrected, an integrated circuit layout definition is prepared, at step 126, which includes a netlist of the selected cells and the interconnections between the cells. The definition further includes placement data for the cells, routing data for the interconnections between the cells and cell layout definitions. The cell layout definitions include layout patterns of the interconnected transistors, local cell routing data and geometry data for the interconnected transistors. The integrated circuit layout definition is then used to fabric the integrated circuit at step 128.

1. Model Description

The virtual-tree-based analytical delay model has two basic constants, $\Delta_1$ and $\Delta_2$. Constant $\Delta_1$ is considered to be the gate delay of binary gates of the simplest form like NAND, NOR, AND and OR for a minimal load (i.e., if these gates have a fan-out count of 1). Constant $\Delta_2$ represents delay growth for each additional count of fan-out. The delay, $\Delta$, of a binary gate can thus be estimated as:

$$\Delta = \Delta_1 + \Delta_2 \cdot (\text{fanoutcount}) \qquad \text{EQ. 1}$$

This linear dependence of delay on the fan-out count is, however, too pessimistic. It has been found that in almost all circumstances the delay dependence estimation can be improved by using a logarithmic dependence. The delay growth for each additional input or output load is logarithmic for symmetric types of gates.

For example, a gate having an output with a large fan-out can be implemented by a balanced binary tree of buffers. Each binary signal branch (an output pin that is coupled to two input pins) is driven by a buffer. The delay for a fan-out count of $2^n$ is equal to $\Delta_1 + n\Delta_2$, where $\Delta_1$ is the basic gate delay, $\Delta_2$ is the buffer delay, and $n = \log_2(\text{fanoutcount})$. Making the substitutions into Equation 1, we have, $$\Delta = \Delta_1 + \Delta_2 \log_2(\text{fanoutcount}) \qquad \text{EQ. 2}$$

Equations 1 and 2 are equal for fan-out counts of 1 and 2. But for larger fan-outs, Equation 2 gives less delay. Equation 2 is therefore a generalization of Equation 1 dealing with not only individual gates, but also a combination of gates and buffer trees.

Another generalization is delay estimation for multi-input gates (for associative functions like AND, OR, XOR, and inversions of these functions). Again, these functions can be implemented with balanced binary trees, which leads to the following analytical delay estimation model:

$$\Delta = \Delta_1 \log_2(\text{fanincount}) + \Delta_2 \log_2(\text{fanoutcount}) \qquad \text{EQ. 3}$$

Equation 3 reflects properties of real delay behavior for individual gates. Analysis of actual technology data shows that this equation can be applied to gates having a small fan-in and fan-out, and the same values of $\Delta_1$ and $\Delta_2$ can be used for different types of gates. The delay information from an entire technology library or set of different technology libraries can be reduced to values of $\Delta_1$ (for binary gates having non-linear logical functions such as AND, OR, NAND and NOR), $\Delta_1$ (for binary gates having linear logical functions such as XOR and XNOR) and $\Delta_2$.

In a particular technology library, there are gates of different functionalities, and even gates with the same functionality, but with different load/delay dependencies. The values for $\Delta_1$ and $\Delta_2$ can be computed by investigating delay behaviors of different technology library cells and all possible variants of the same cells and by combining these cells in various configurations to achieve a minimum possible delay estimation for a set of Boolean functions. These estimated delay values are then used in a best-fit fashion to extract the values for the constants $\Delta_1$ and $\Delta_2$ that are used in the delay model shown in Equation 3. Using these values for the coefficients, a reasonably good basis for delay optimization of complex multi-input and large fan-out netlist elements can be obtained before mapping and placement.

Equation 3 gives the delay behavior for virtual models of Boolean functions that can be implemented with the set of gates listed in Table 1.

TABLE 1

| Gate Function | Number of inputs | Number of outputs | Delay |
|---|---|---|---|
| NOT | 1 | 1 | 0 |
| BUFFER | 1 | n > 1 | $\Delta_2 \log_2 n$ |
| AND | n > 1 | 1 | $\Delta_1 \log_2 n$ |
| OR | n > 1 | 1 | $\Delta_1 \log_2 n$ |

This delay model is more accurate than traditional models (like models based on the number of logic levels in the cell), because it has no "free" fan-ins or fan-outs. Every additional count of fan-in or fan-out has a corresponding delay penalty. The delay along a particular path in a logic design is easy to calculate because the path delay is the sum of the individual gate delays in that path, and all the gate delays depend only on the delay estimate for that gate. In more "technical" delay models, neighboring gates must also be considered in order to calculate the delay of a gate.

2. Analysis of Technology Data

The model can be verified using actual technology gates to implement a variety of different Boolean functions. For this purpose, numerous possible implementations of various Boolean functions are considered, with each implementation using logic trees of actual gates of the technology, such as buffer, NOT, AND, NAND, OR, NOR, XOR and XNOR gates. Also, parallel-connected gates are also used. In these gates, a parallel connection of N copies of the same technology gate is considered to be "more powerful" since it is capable of driving N more loads with the same delay and the same functionality. Each individual gate in the parallel connection drives 1/N times the original load. However, these "parallelized" gates have N times more input capacitance than a single technology gate. For each of the Boolean functions considered above, the minimum possible delay that can be obtained is calculated for different load values.

Table 2 provides a list of sample Boolean functions that can be considered when verifying the delay model.

TABLE 2

| | Functions Implemented |
|---|---|
| 1.1 | X |
| 1.2 | NOT X |
| 2.1 | X AND Y |

TABLE 2-continued

Functions Implemented

| | |
|---|---|
| 2.2 | X OR Y |
| 2.3 | X NAND Y, i.e., NOT (X AND Y) |
| 2.4 | X NOR Y, i.e., NOT (X OR Y) |
| 3.1 | (X AND Y) AND (Z AND T) |
| 3.2 | (X AND Y) OR (Z AND T) |
| 3.3 | (X AND Y) NAND (Z AND T) |
| 3.4 | (X AND Y) NOR (Z AND T) |
| 3.5 | (X OR Y) OR (Z OR T) |
| 3.6 | (X OR Y) OR (Z OR T) |
| 3.7 | (X OR Y) NAND (Z OR T) |
| 3.8 | (X OR Y) NOR (Z OR T) |

In Table 2, functions 1.1 and 1.2 (1.X, where "X" is an integer variable) are considered to have zero levels of binary logic. Functions 2.1 through 2.4 (2.X) have one level of binary logic. Functions 3.1 through 3.8 (3.X) have two levels of binary logic. In one embodiment, delay tables were also formed for 16 additional functions that have three levels of binary logic (4.X), as well as for functions with more complicated structures of one level, where XOR and/or XNOR gates were used in addition to AND and OR gates.

For a given technology library, each of the basic gate elements has a specified input capacitance for each input of the gate and has delays for each output as a function of load. To simplify calculations, an average value can be used for the input capacitance of a cell instead of a separate value for each input of the cell. Also, in one embodiment, a single delay(load) function, which is an average of all delay functions from different inputs, is used. That is, a gate G is considered a black box specified by a logical function parameter (such as buffer NOT, AND, NAND, OR, NOR, XOR and XNOR), an input capacitance parameter "C" and a delay function parameter, delay=f(load).

When adding parallel-connected gates to the list of basic gate elements, "G", that are used to implement the Boolean functions listed above, a new gate object, "NG", can be defined, where "N" is a positive integer representing the number of individual gates that are connected in parallel with one another. The parameters for each gate can then be generalized to:

1) function (NG)=function (G);
2) capacitance (NG)=N capacitance (G); and
3) delay (NG, load)=delay (G, load/N).

When considering numerous possible implementations of each Boolean function listed above, logic trees of the type shown in FIG. 2 are used. FIG. 2 is a diagram illustrating an example of a 2-level logic tree that uses basic actual technology gates to implement one of the Boolean functions listed above. Tree 200 includes inputs 201, output 202 and gates 203–208. Gates 203 are labeled "X" and include gates of a fixed type, such as a basic inverter in the library. To avoid "free" branching of primary inputs 201, all trees are defined such that their primary inputs drive only one unit of "standard load" without extra delay. In this example, the standard load is the input capacitance of one basic inverter.

Gates 204 are labeled "A1" and include any sequence of "parallelized" buffers or inverters. The sequence may be empty so as to include zero buffers or inverters. Gates 206 and 208 are labeled "A2" and A3", respectively, and also include any sequence of "parallelized" buffers or inverters. Gates 205 are labeled "B1" and include any "parallelized" symmetric binary gate. Gate 207 is labeled "B2" and includes another "parallelized" symmetric binary gate.

Then, depending on the actual implementation of gates 204–208, tree 200, represented by the variable "T", has a logical function "f(T)", a standard input capacitance (because of added gates 203) and a delay dependence, "delay(T, load)".

For each logical function F (such that it can be implemented by the trees T) the best possible delay for each load value is calculated according to the relation:

$$\text{delay}(F, \text{load}) = \min_T \text{delay}(T, \text{load}) \qquad \text{EQ. 4}$$

where the minimum is taken for all trees T such that f(T)=F.

Equation 4 gives one delay(F, load) function per Boolean function F, where the delay at each load is the minimum delay for all trees T of function F. The delay(F, load) values are calculated using all possible trees T having 0, 1, 2, ... , $NL_{MAX}$ levels of binary gates, and for loads equal to 1, 2, ..., $L_{MAX}$ times the "standard load", where $NL_{MAX}$ is the maximum number of binary logic levels, such as 3, and $L_{MAX}$ is a maximum load, such as 1000.

From the results of Equation 4, several observations can be made. First, functions 1.1 and 1.2 in Table 2 have similar delays, especially for larger load values. Second, all functions 2.1 through 2.4 (i.e., "2.X" where X is an integer variable) have similar delays, especially for larger load. Third, all functions 3.1 through 3.8 (i.e., "3.X") have similar delays, especially for larger load values. Fourth, all 16 functions of "4.X" (with 3 levels of logic) have similar delays, especially for larger load values. Thus, the delay(F, load) function depends largely on the number of logic levels in the function F. The number of logic levels can therefore be used to group the various Boolean functions together.

For small loads, there was a bit more delay than a log-linear dependence of the form $$C_1 + C_2 \log_2(\text{load}) \qquad \text{EQ. 5}$$

can predict, where $C_1$ and $C_2$ are coefficients corresponding to basic gate delay and fan-out delay, respectively. This mismatch for small loads can be corrected by taking into consideration the effect of internal output capacitance of gates, such that Equation 5 becomes, $$C_1 + C_2 \log_2(\text{load} + C_p) \qquad \text{EQ. 6}$$

where $C_p$ is a parameter modeling the effect of parasitic capacitance.

Each of the delay(F, load) functions can therefore be approximated by a formula of the form:

$$\text{delay}(F, \text{load}) \sim C_1 + C_2 \log_2(\text{load} + C_p) \qquad \text{EQ. 7}$$

where the value of $C_p$ can vary between 1 and 10 standard loads, depending on the function F.

Let the parameter "NL(F)" be the number of binary logical levels in tree T, where F is the logical function implemented by tree T. Let "NLL(F)" be the number of binary logical levels that include XOR or XNOR gates in tree T. The values of delta(F, load) will therefore depend mostly on the values NL(F) and NLL(F). Different functions $F_1$, $F_2$ with $NL(F_1)=NL(F_2)$ and $NLL(F_1)=NLL(F_2)$ are such that:

$$\text{delay}(F_1, \text{load}) \sim \text{delay}(F_2, \text{load}) \qquad \text{EQ. 8}$$

Moreover, it was found that coefficients $C_2$ in Equation 7 are approximately equal for all functions F. Coefficients C1 are different from one another for different functions F, but $$C_1 \sim C_{1A} + C_{1B} NL(F) + C_{1C} NLL(F) \qquad \text{EQ. 9}$$

where $C_{1A}$, $C_{1B}$, $C_{1C}$ are constants. The constant $C_{1A}$ has no practical significance since it reflects the input capacitance normalization provided by gates 203 in FIG. 2. However, constants $C_{1B}$, $C_{1C}$, $C_2$ can be interpreted meaningfully.

For binary gates having non-linear logical functions (such as AND, NAND, OR and NOR gates), $$\Delta_1 = C_{1B} \text{ (binary non-linear gates)} \quad \text{EQ. 10}$$

For binary gates having linear logical functions (such as XOR and XNOR gates), $$\Delta_1 = C_{1B} + C_{1C} \text{ (binary linear gates)} \quad \text{EQ. 11}$$

Finally, $C_2$ can be interpreted as, $$\Delta_2 = C_2 \quad \text{EQ. 12}$$

Thus, once the values for $C_{1B}$, $C_{1C}$ and $C_2$ are calculated for a particular technology library, or set of libraries, these values can be used to select parameters $\Delta_1$ and $\Delta_2$ for tree-like functional blocks that are implemented with actual technology gates. Then, the delay behavior of a tree-like functional block that is unmapped to actual technology gates would be the same if the parameters $\Delta_1$ and $\Delta_2$ were used to model the delay behavior.

3. Calculating Constants $\Delta_1$ and $\Delta_2$

The input capacitance and output loading data for basic gates in an actual technology cell library are used to find generic values for $\Delta_1$ and $\Delta_2$, which can be applied to predict the delay behavior of all multi-input and multi-output functional blocks that can be implemented by these basic gates. When finding the best values for constants $\Delta_1$ and $\Delta_2$, a variety of different Boolean functions "F" that can be implemented with these basic gates are considered.

A. Distribution of Logical Functions into Different Classes

First, the different logical functions F are distributed into classes, such that all functions in a particular class have the same combination of logic levels NL(F) and NLL(F). In one example, Boolean functions having up to three binary logic levels are divided into ten classes or groups.

FIG. 3 is a graph illustrating the typical behavior of the delay(F, load) dependency for the ten different classes of Boolean functions F. X-axis 300 represents the number of standard loads on a log scale. Y-axis 301 represents delay in nanoseconds (ns). Each curve in FIG. 3 represents the delay(F, load) dependency for a respective one of the classes and is labeled with a unique notation (i,j), where "i" equals the number of binary logic levels in the corresponding class of functions F and "j" equals the number of binary XOR or XNOR levels in the total number of logic levels "i".

The functions in the classes shown in FIG. 3 are divided in the following manner:

1) 1-input functions having 0 levels:
   group (0,0) (where i=0 and j=0) includes the functions:
   x; and
   NOT x
   (These two functions are referred to as "elements of the set A").

2) 2-input functions having 1 level:
   group (1,0) includes the functions:
   x AND y;
   x OR y;
   NOT(x AND y); and
   NOT(x OR y)
   (The first two functions in group (1,0) are referred to as "elements of the set B").
   group (1,1) includes the functions:
   x XOR y; and
   NOT(x XOR y)
   (The first function in group (1,1) is referred to as the only element of the set C).

3) 4-input functions having 2 levels (which have the form n(p(q(x1,x2), q(x3,x4))), where n ∈ A, p and q are members of specific sets of 2-input functions):
   group (2,0) has 8 functions:
   p, q ∈ B
   group (2,1) has 12 functions:
   p ∈ B, q ∈ C, or p ∈ C, q ∈ B
   group (2,2) has 2 functions:
   x1 XOR x2 XOR x3 XOR x4; and
   NOT(x1 XOR x2 XOR x3 XOR x4)
   (or, p, q ∈ C)

4) 8-input functions having 3 levels (which have form n(p(q(r(x1, x2), r(x3, x4)), q(r(x5, x6), r(x7, x8)))), where n ∈ A, p, q, r are members of specific sets of 2-input functions):
   group (3,0) has 16 functions:
   p, q, r ∈ B
   group (3,1) has 24 functions:
   one of p, q, r belongs to C; and
   remaining two belong to B.
   group (3,2) has 12 functions:
   one of p, q, r belongs to B; and
   remaining two belong to C.
   group (3,3) has 2 functions:
   x1 XOR . . . XOR x8; and
   NOT(x1 XOR . . . XOR x8)
   (or, all three p, q, r ∈ C)

The above-defined groups (as well as their generalization to any number of binary logic levels) have the following properties:

(a) if f is element of group (i,j), then NOT(f) is also element of (i,j);

(b) if f is element of group (i,j), then all four functions of the form:

$$g(f(x1, \ldots, xN), f(y1, \ldots, yN))$$

where N equals the fan-in of f (i.e. 2 in the i-th power), g is any of: x AND y, x OR y, NOT(x AND y), NOT(x OR y), belong to group (i+1,j); and (c) if f is element of group (i,j), then both functions of the form:

$$g(f(x1, \ldots, xN), f(y1, \ldots, yN))$$

where N equals the fan-in of f (i.e. 2 in the i-th power), g is any of: x XOR y, NOT(x XOR y), belong to group (i+1,j+1).

This provides an example of a constructive definition of each group. All that is needed is an "initialization" to define group (0,0).

B. Calculation of Tables of Delay Values, delay(F, load), for Different Boolean Functions F Tables of the delay values, delay(F, load), are formed for different Boolean functions F. These are calculated using Equation 4 above. For each load value, the corresponding delay values for the various functions F in the class are averaged, for example, to arrive at a common delay(class, load) dependency for all functions F in the class. Each curve in FIG. 3 represents one of these common delay(class, load) dependencies, which reflects the approximation given in Equation 8.

For each group (i,j), where $0 \leq j \leq i \leq NL_{MAX}$, and for each function F from this group, an array of delay values, delay(F, load), are calculated, where load=0, 1, 2, ..., $L_{MAX}$ "standard loads".

To do this, delay values for actual technology gates are used. In the analysis, all buffers, inverters, and 2-input gates (AND, NAND, OR, NOR, XOR, XNOR) are considered. Let the name of this set of gates be "S". All delay-related information for each gate G is reduced to:

1) input capacitance (or average of 2 input capacitances for 2-input gates), which are given the notation, "C(G)"; and 2) values of delay (or average of 2 delays for 2-input gates), if load=0,1, ..., $L_{MAX}$ standard loads, which are given the notation, "D(G,load)".

FIG. 4 is a diagram illustrating an example of an algorithm 400 for calculating an array of delay(F, load) values for each function F of each group (i,j) using the delay-related information given above, according to one embodiment of the present invention. In algorithm 400, the constant $L_{MAX}$ defines the maximum number of standard loads used in the calculations, such as $L_{MAX}$=1000, the constant $N_{MAX}$ defines the maximum possible number of gates that can be coupled in parallel to one another for "parallelized" gates (the maximum value of N in "NG" used above), such as $N_{MAX}$=500, and the constant $NL_{MAX}$ defines the maximum available number of binary logic levels, such as $NL_{MAX}$=3.

At 401, algorithm 400 begins an initialization routine, "Step 1", which initializes the data arrays, delay(F, load), for each function F. If F is NOT(x), then algorithm 400 lets delay(F, load)=D(G, load), for each load=0,1, ..., $L_{MAX}$, where G is the "most standard" inverter of the given technology library. For all remaining functions F, algorithm 400 lets all values delay(F, load) be +infinity (or some other large number).

At 402, the main loop "Step 2" begins. Step 2 is repeated to find, for each logical function F (such that it can be implemented by the trees T), for each group (i,j), the best possible delay, according to Equation 4 above. The delay(F, load) values are calculated using all possible trees T having 0, 1, 2, ..., $NL_{MAX}$ levels of binary gates, and for loads equal to 0, 1, 2, ..., $L_{MAX}$ times the "standard load". Each run of Step 2 tries to add more gates to the trees having the best known delays (in a previous iteration). If the result is faster than the previously best known result for the same function, then the corresponding delay is updated in the respective array. Step 2 is repeated until there are no more updates to the arrays delay(F, load). The result is one array of delay(F, load) values for each function F in each class (i,j).

C. Approximating Each Group (i,j) of functions F by a Formula

Once all of the arrays of delay(F, load) values have been calculated, a common delay(class, load) dependency is approximated for each class by a formula like that given in Equation 7, with respective coefficients $C_1$, $C_2$ and $C_p$.

1. Calculation of $C_1$, $C_2$ and $C_p$

Best-fit values for the coefficients $C_1$, $C_2$ and $C_p$ of Equation 7 are calculated for each group (i,j) based on the delay values for loads 1, 2, ..., $L_{MAX}$, calculated above. A best-fit is obtained by considering all possible values of $C_p$ with some small step (such as from 0 to 10 with step 0.1). Then, corresponding values of $C_1=C_1(C_p)$ and $C_2=C_2(C_p)$ can be found using a standard least-square method for linear approximation. Let the variable err($C_p$) be the mean square error of this approximation. Then, a value $C_p$ is chosen so as to minimize err($C_p$). Given the value of $C_p$, the values of $C_1$ and $C_2$ can be calculated from $C_1=C_1(C_p)$ and $C_2=C_2(C_p)$. The values for $C_1$, $C_2$ and $C_p$ for all classes are now known. In one example, $C_2$ is calculated to be 0.45 ns.

2. Calculation of $C_{1A}$, $C_{1B}$ and $C_{1C}$

Finally, given the coefficients C1, C2 and $C_p$ for each group (i,j), one set of values $C_{1A}$, $C_{1B}$, and $C_{1C}$ can be calculated for all functions F. The simplest method takes three values of $C_1$: for example, the values of $C_1$ for the classes of Boolean functions having (NL,NLL) equal to (0,0), (1,0), and (1,1). In this case, given Equation 9 and the number of logic levels NL and NLL in each class, the following relationship can be defined:

$$C_1(0,0)=C_{1A} \qquad \text{EQ. 13}$$

$$C_1(1,0)=C_{1A}+C_{1B} \qquad \text{EQ. 14}$$

$$C_1(1,1)=C_{1A}+C_{1B}+C_{1C} \qquad \text{EQ. 15}$$

Solving for $C_{1A}$, $C_{1B}$ and $C_{1C}$, $$C_{1A}=C_1(0,0) \qquad \text{EQ. 16}$$

$$C_{1B}=C_1(1,0)-C_1(0,0) \qquad \text{EQ. 17}$$

$$C_{1C}=C_1(1,1)-C_1(1,0) \qquad \text{EQ. 18}$$

A more accurate approach is to use all available values of $C_1$ from all classes of functions and to compute $C_{1A}$, $C_{1B}$ and $C_{1C}$ as a solution of the following minimization problem:

Given values $C_1(i,j)$ for different i, j (for example, for all i and j, such that $0 \leq j \leq i \leq NL_{MAX}$), the coefficients $C_{1A}$, $C_{1B}$ and $C_{1C}$ can be found that minimize the sum, $$\Sigma_{i,j}[C_{1A}+i\,C_{1B}+j\,C_{1C}-C_1(i,j)]^2 \qquad \text{EQ. 19}$$

That is, the $C_{1X}$s are parameters of the best linear approximation of a 2-variable function. They can be found using standard methods.

In yet another alternative embodiment, the parameters can be estimated directly from the curves shown in FIG. 3. Looking at FIG. 3, when the load grows, all curves approach parallel straight lines. The slope of these lines gives a value for $C_{1A}$. To measure the slope, line 303 is drawn "parallel" to the curves, through the origin of FIG. 3, at point (1.0, 0.0). $C_{1A}$ is the second coordinate of point (2.0, $C_{1A}$) on the same straight line 303. Looking at Y-axis 301, $C_{1A}$~0.045 ns.

The value of $C_{1B}$ is the average difference of delays for the same load in each pair of curves in FIG. 3 with parameters (i,j) and (i+1, j). In other words, $C_{1B}$ is the delay penalty for adding one more logic level to the Boolean function. For larger loads, all six such pairs give more or less equal differences: approximately 0.035 ns.

Similarly, the value of $C_{1C}$ is the average difference of delays for the same load in each pair of curves with parameters (i,j) and (i, j+1). In other words, $C_{1C}$ is the additional delay penalty for a logic level being an XOR or XNOR type. For larger loads, all six such pairs give more or less equal differences: approximately 0.12 ns.

3. Calculating $\Delta_1$ and $\Delta_2$

Given these values for $C_{1B}$, $C_{1C}$ and $C_2$ and Equations 10–12, $$\Delta_1=C_{1B}\text{~}0.035 \text{ ns (for binary non-linear gates)} \qquad \text{EQ. 20}$$

$$\Delta_1=C_{1B}+C_{1C}\text{~}0.15 \text{ ns (for binary linear gates)} \qquad \text{EQ. 21}$$

$$\Delta_2=C_2\text{~}0.045 \text{ ns} \qquad \text{EQ. 22}$$

Thus, by using data for actual technology gates, generic values for $\Delta_1$ and $\Delta 2$ can be obtained for estimating the delay through multi-input and multi-output blocks with Equation 3 as a function of only the fan-in count and the fan-out count. The particular value used for $\Delta_1$ depends on whether the logical function of the block would contain linear binary gates or non-linear binary gates. Therefore, based on the logical function of the block, the delay behavior can be modeled prior to mapping the block into actual technology gates since all gates have approximately the same values of $\Delta_2$, all non-linear gates have approximately the same values of $\Delta_1$, and all linear gates have approximately the same values of $\Delta_1$.

The virtual tree-based delay model given in Equation 3 provides delay predictions for multi-input and multi-output functional blocks in a netlist, which are really different configurations of basic logic functions enumerated in Table 2. Given values of $\Delta_1$ and $\Delta_2$, Equation 3 is simple and quick to calculate. These predictions have been found to approximate actual delay values reasonably well and also gives important observations of the common delay behavior of different classes of functions, which can be important initial assumptions for delay optimization of netlists.

Although the present invention has been described with reference to preferred embodiments, workers skilled in the art will recognize that changes may be made in form and detail without departing from the spirit and scope of the invention.

What is claimed is:

1. A pre-placement delay model for a logical function block of an integrated circuit design, wherein the integrated circuit comprises a plurality of different types of the logical function block, the model comprising:

a fan-in count variable, having a value indicative of a number of inputs to the logical function block;

a fan-out count variable, having a value indicative of a number of inputs of other logical function blocks in the integrated circuit design that are driven by an output of the logical function block; and a delay variable, which has a value that is a function of a sum of a first delay coefficient multiplied by a binary logarithm of the fan-in count variable and a second delay coefficient multiplied by a binary logarithm of the fan-out count variable, wherein the first delay coefficient comprises a first value for each of the plurality of types of the logical function block having only non-linear logical function gates and a second value for each of the types having a linear logical function gate.

2. The pre-placement delay model of claim 1 wherein the second delay coefficient has the same value for all of the different types of the logical function block.

3. The pre-placement delay model of claim 1 wherein the integrated circuit design is capable of being fabricated in a plurality of different semiconductor technologies and wherein:

the pre-placement delay model is generic to the plurality of different semiconductor technologies such that the first and second delay coefficients are the same for each of the plurality of different semiconductor technologies.

4. A method of modeling delay through a logical function block within an integrated circuit design prior to placement and routing, the method comprising:

(a) identifying a fan-in count indicative of a number of inputs to the logical function block;

(b) identifying a fan-out count indicative of a number of inputs to other logical function blocks in the integrated circuit design that are driven by an output of the logical function block;

(c) producing a propagation delay estimate for the logical function block as a function of the fan-in count and the fan-out count;

(d) identifying a plurality of Boolean functions;

(e) for each of the Boolean functions, identifying a plurality of different circuit configurations that implement that Boolean function with a plurality of cells selected from a particular semiconductor technology library;

(f) for each of the circuit configurations, producing a delay estimate as a function of load based on delay information provided with the technology library for the plurality of cells; and (g) for each of the Boolean functions, selecting a minimum one of the delay estimates produced for that Boolean function in (e).

5. The method of claim 4 wherein (c) comprises:

(c)(1) multiplying a binary logarithm of the fan-in count by a first delay coefficient to produce a first product;

(c)(2) multiplying a binary logarithm of the fan-out count by a second delay coefficient to produce a second product; and (c)(3) summing the first and second products to produce the delay estimate.

6. The method of claim 5 wherein the delay estimate produced in (c) is produced as a function of only the binary logarithms of the fan-in and fan-out counts and the first and second delay coefficients.

7. The method of claim 5 and further comprising:

(h) deriving the first and second delay coefficients based on the minimum delay estimates selected in (g).

8. The method of claim wherein 7 comprises deriving the first and second delay coefficients based on a best-fit analysis of the minimum delay estimates as a function of load selected in (g) for the plurality of Boolean functions.

9. The method of claim 7 and further comprising:

(i) performing (e) through (g) for a plurality of different semiconductor technology libraries; and (j) deriving the first and second delay coefficients based on the minimum delay estimates selected in (g) for the plurality of different semiconductor technologies.

10. The method of claim 4 wherein (c) is performed prior to mapping the logical function block into cells of a specific cell technology library.

11. A generic semiconductor cell library which, for each cell in the library, comprises:

a functional model; and propagation delay model means for modeling propagation delay through the cell as a function of only two design variables, a fan-in count variable and a fan-out count variable, prior to mapping the cell into at least one cell of a specific cell technology library, wherein the fan-in count variable indicates a number of inputs to the cell and the fan-out count variable indicates a number of inputs of other cells that are driven by an output of that cell.

12. The generic semiconductor cell library of claim 11 wherein the propagation delay model means comprises:

means for producing a propagation delay estimate for the cell as a function of a binary logarithm of the fan-in count variable and a binary logarithm of the fan-out count variable.

13. The generic semiconductor cell library of claim 12 wherein the propagation delay model means comprises:

means for multiplying the binary logarithm of the fan-in count variable by a first delay coefficient to produce a first product;

means for multiplying the binary logarithm of the fan-out count variable by a second delay coefficient to produce a second product; and means for summing the first and second products to produce a propagation delay estimate.

14. A pre-placement delay model for a logical function block of an integrated circuit design, which is capable of being fabricated in a plurality of different semiconductor technologies, the model comprising:

a fan-in count variable, having a value indicative of a number of inputs to the logical function block;

a fan-out count variable, having a value indicative of a number of inputs of other logical function blocks in the integrated circuit design that are driven by an output of the logical function block; and a delay variable, which has a value that is a function of a first delay coefficient multiplied by a binary logarithm of the fan-in count variable and a second delay coefficient multiplied by a binary logarithm of the fan-out count variable, wherein the pre-placement delay model is generic to the plurality of different semiconductor technologies such that the first and second delay coefficients are the same for each of the plurality of different semiconductor technologies.

15. A method of modeling delay through a logical function block within an integrated circuit design prior to placement and routing, the method comprising:

(a) identifying a fan-in count indicative of a number of inputs to the logical function block;

(b) identifying a fan-out count indicative of a number of inputs to other logical function blocks in the integrated circuit design that are driven by an output of the logical function block; and (c) producing a propagation delay estimate for the logical function block as a function of a binary logarithm of the fan-in count and a binary logarithm of the fan-out count, prior to mapping the logical function block into cells of a specific cell technology library.

* * * * *